United States Patent
Mayer et al.

(10) Patent No.: US 7,868,717 B2
(45) Date of Patent: Jan. 11, 2011

(54) ACOUSTIC WAVE TRANSDUCER AND FILTER COMPRISING SAID TRANSDUCER

(75) Inventors: Markus Mayer, Taufkirchen (DE); Karl Christian Wagner, Unterhaching (DE); Andreas Bergmann, Haiming (DE)

(73) Assignee: EPCOS AG, Munich (DE)

(*) Notice: Subject to any disclaimer, the term of this patent is extended or adjusted under 35 U.S.C. 154(b) by 253 days.

(21) Appl. No.: 12/158,171

(22) PCT Filed: Dec. 18, 2006

(86) PCT No.: PCT/DE2006/002271
§ 371 (c)(1),
(2), (4) Date: Jul. 31, 2008

(87) PCT Pub. No.: WO2007/073722

PCT Pub. Date: Jul. 5, 2007

(65) Prior Publication Data
US 2008/0315972 A1      Dec. 25, 2008

(30) Foreign Application Priority Data
Dec. 23, 2005   (DE) ................. 10 2005 061 800

(51) Int. Cl.
*H03H 9/145* (2006.01)
*H03H 9/64* (2006.01)

(52) U.S. Cl. .............. 333/193; 333/194; 333/195; 310/313 B

(58) Field of Classification Search ......... 333/193–196; 310/313 B
See application file for complete search history.

(56) References Cited

U.S. PATENT DOCUMENTS

| | | | | |
|---|---|---|---|---|
| 4,999,535 | A * | 3/1991 | Mariani et al. | 310/313 B |
| 6,072,377 | A * | 6/2000 | Tajima et al. | 333/154 |
| 6,121,860 | A | 9/2000 | Tsutsumi et al. | |
| 6,404,101 | B1 | 6/2002 | Taniguchi et al. | |
| 6,853,113 | B2 | 2/2005 | Bergmann | |
| 7,250,832 | B2 * | 7/2007 | Kondratiev | 333/193 |

(Continued)

FOREIGN PATENT DOCUMENTS

DE      196 38 398      4/1998

(Continued)

OTHER PUBLICATIONS

English language machine translation of JP 09-275326 published Oct. 21, 1997.*

(Continued)

*Primary Examiner*—Barbara Summons
(74) *Attorney, Agent, or Firm*—Fish & Richardson P.C.

(57) ABSTRACT

A transducer includes an acoustic track in which an acoustic wave can be propagated, the acoustic track having a transversal fundamental mode, the acoustic track being subdivided in a transversal direction into an excitation area and two peripheral areas. The transducer also includes a first outside area and a second outside area bordering the acoustic track such that the acoustic track is arranged in the transversal direction between the first and second outside area. The transducer also includes peripheral areas configured such that the longitudinal phase velocity $v_{RB}$ of the acoustic wave in the respective peripheral area is greater than the longitudinal phase velocity $v_{MB}$ of the wave in the excitation area.

25 Claims, 9 Drawing Sheets

U.S. PATENT DOCUMENTS

| | | | |
|---|---|---|---|
| 7,453,334 B1 * | 11/2008 | Abbott et al. | ................ 333/195 |
| 2003/0117240 A1 * | 6/2003 | Inoue et al. | ................ 333/195 |
| 2004/0251990 A1 * | 12/2004 | Ueda et al. | ................ 333/195 |
| 2007/0018755 A1 | 1/2007 | Mayer et al. | |

FOREIGN PATENT DOCUMENTS

| | | | | |
|---|---|---|---|---|
| DE | 199 02 162 | | 8/2000 | |
| DE | 100 09 517 | | 8/2001 | |
| DE | 101 47 116 | | 5/2002 | |
| DE | 103 31 323 | | 2/2005 | |
| EP | 0 935 341 | | 8/1999 | |
| EP | 1 471 638 | | 10/2004 | |
| JP | 06-164297 | * | 6/1994 | ................ 333/195 |
| JP | 09-275326 | * | 10/1997 | |
| JP | 10-145173 | * | 5/1998 | |

OTHER PUBLICATIONS

English language abstract from Patent Abstracts of Japan for JP 09-275326 published Oct. 21, 1997.*

International Search Report for PCT/DE2006/002271.

Written Opinion for PCT/DE2006/002271.

Hirota K. et al "Analysis of SAW Grating Waveguides Considering Velocity Dispersion Caused by Reflectivity" IEEE Ultrasonics Symp. Proc. Oct. 17-20, 1999, vol. 1, pp. 221-226, XP010502311.

Wilkus S. A. et al. "Transverse Mode Compensation of Surface Acoustic Wave Filters" Ultrasonics Symp. Oct. 16, 1985, vol. 1, pp. 43-47, XP008035343.

Tanski W. "GHz SAW Resonators" Ultrasonics Symp. 1979, pp. 815-823.

Internet Citation "Distributed Parameter Equivalents and Models with Dissipation" Sept. 16, 2004, http://web.mit.edu/6.013_book/www/chapter14/14.7.html XP002300884.

English translation of Written Opinion for PCT/DE2006/002271.

* cited by examiner

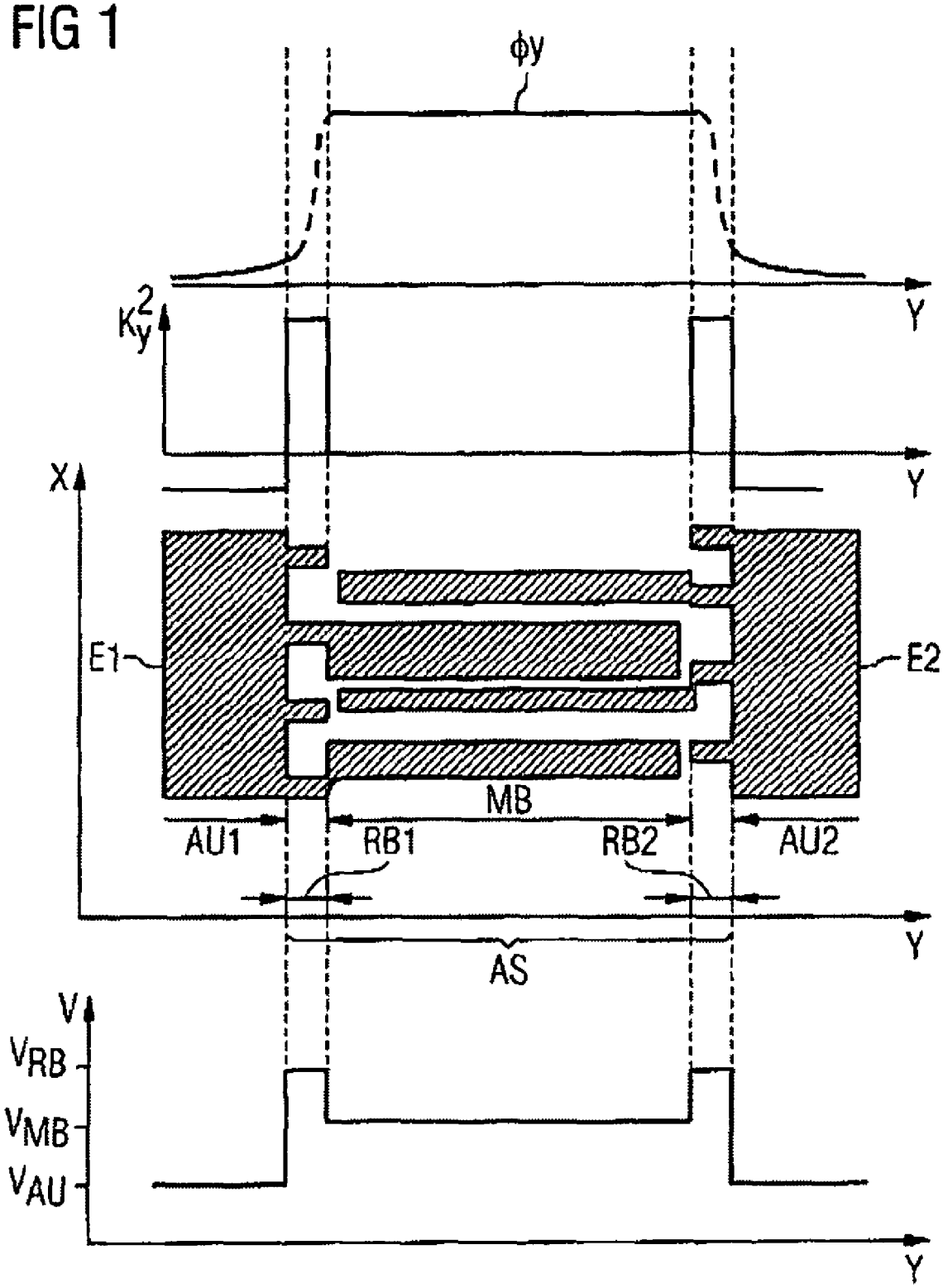

FIG 4
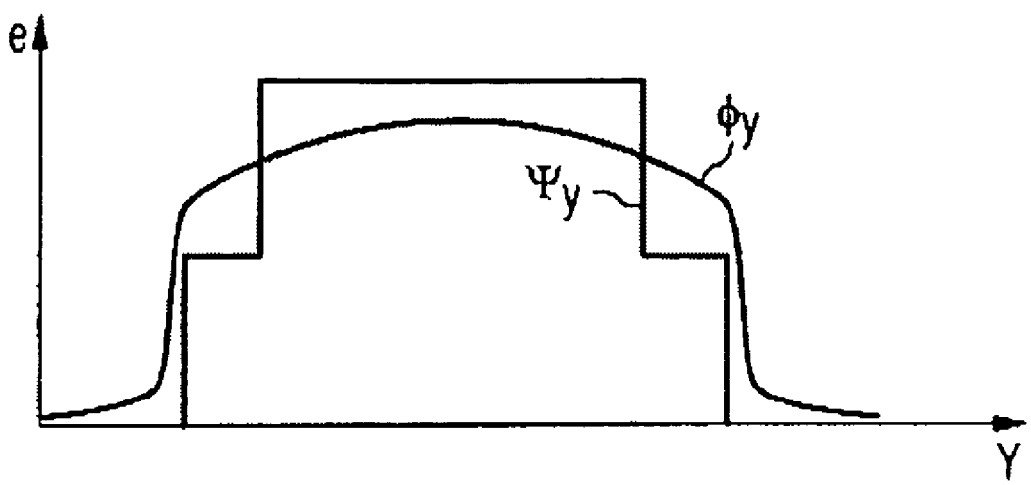
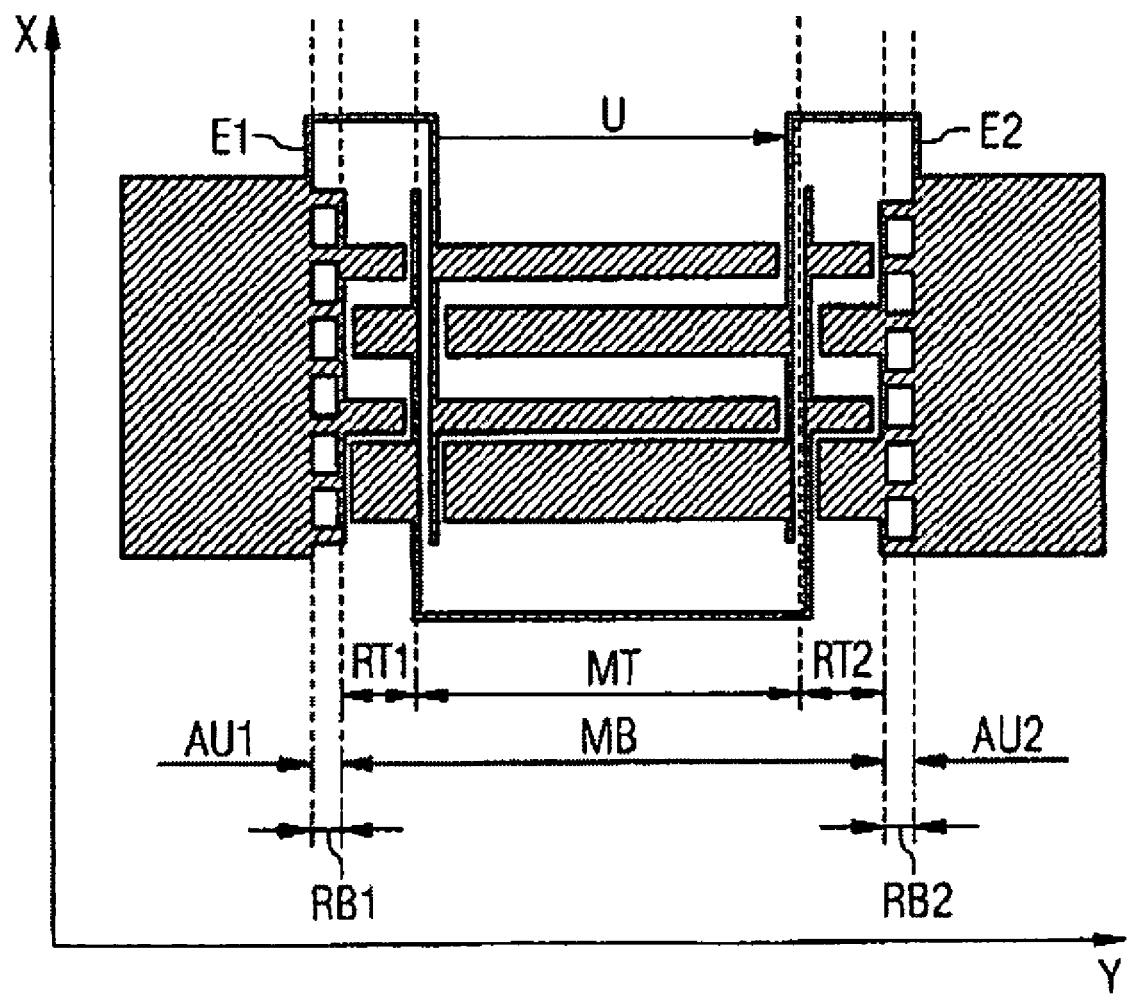

FIG 7
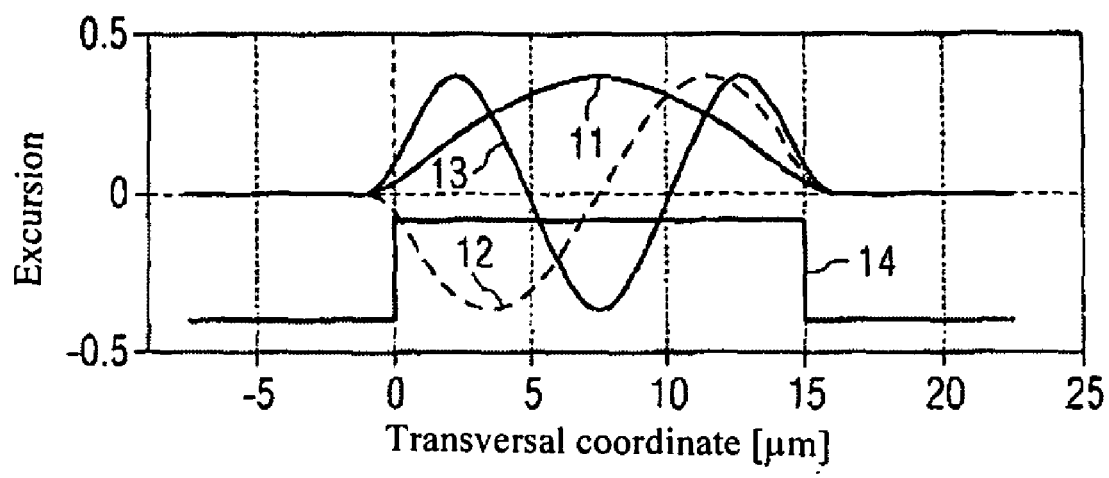
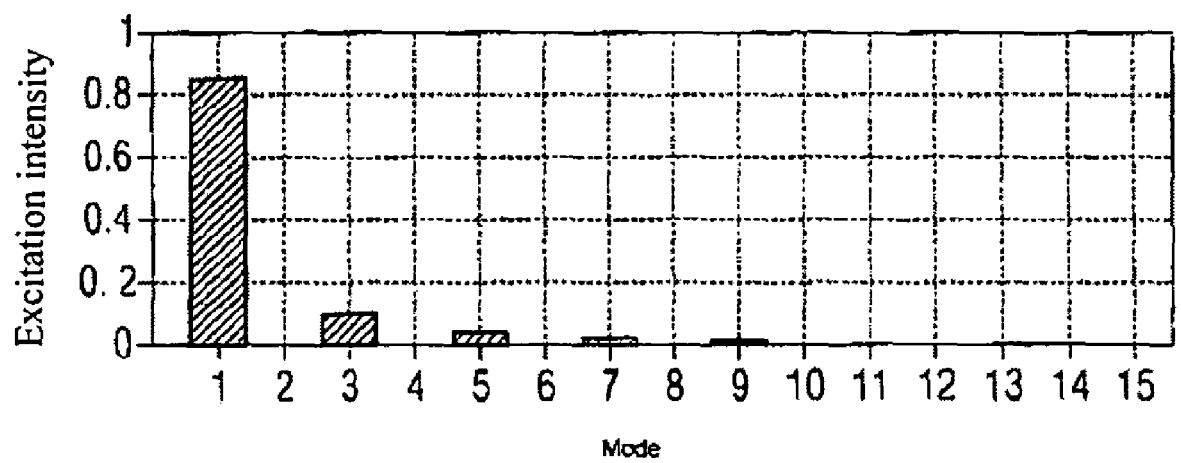

FIG 8
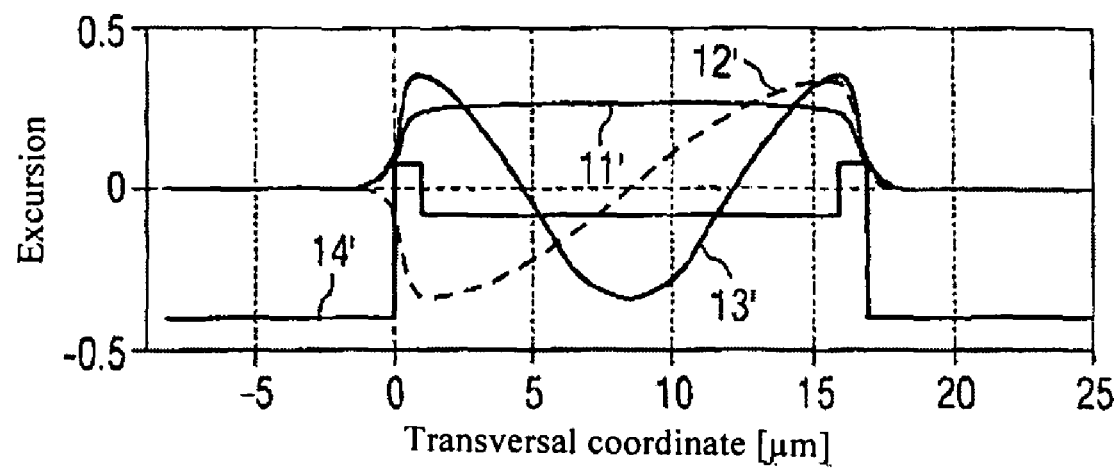
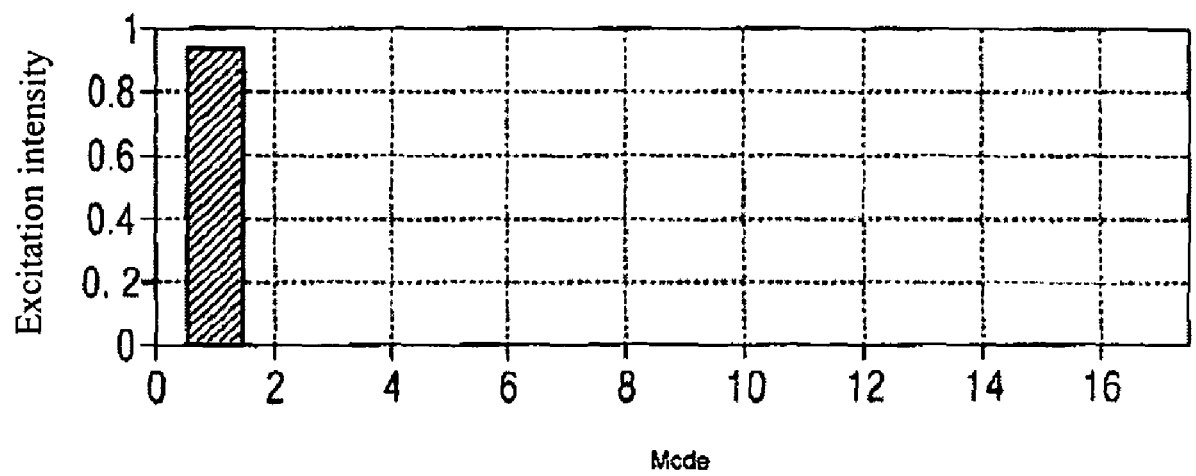

ACOUSTIC WAVE TRANSDUCER AND FILTER COMPRISING SAID TRANSDUCER

CROSS REFERENCE TO RELATED APPLICATIONS

Pursuant to 35 USC §120, this application claims the benefit PCT/DE2006/002271 filed Dec. 18, 2006 which claims the benefit of German Patent Application No. 102005061800.6 filed Dec. 23, 2005. Each of these applications is incorporated by reference in its entirety.

TECHNICAL FIELD

A SAW transducer will be specified, i.e., an electroacoustic transducer operating with surface acoustic waves (SAW). SAW transducers are used particularly in filters for portable mobile radio devices.

BACKGROUND

In a SAW filter, an electrical signal is converted into an acoustic wave and vice versa. In the propagation of the acoustic wave in a SAW transducer, diffraction losses arise in the peripheral area of the transducer due to the radiation of part of the surface waves in the transversal direction. A method for suppressing higher transversal modes or for adapting the excitation profile of a transducer to the form of the fundamental transversal mode is known, for instance, from the publication DE 196 38 398 C2.

Additional SAW transducers that have regions in the transversal direction with mutually differing velocities of the acoustic wave are known from the publications DE 10331323 A, EP 1,471,638 A2 and U.S. Pat. No. 6,121,860.

SUMMARY

One problem to be solved is to specify a transducer operating with surface acoustic waves in which interfering transversal modes are suppressed.

An electroacoustic transducer comprises a piezoelectric substrate and electrode fingers arranged thereon that form an electrode grating for exciting an acoustic wave.

A transducer is specified that has an acoustic track. The acoustic track is arranged on a piezoelectric substrate. The acoustic track comprises electrode fingers interleaved with one another which are substantially alternately connected to a first and a second bus bar. A surface acoustic wave that can propagate inside the acoustic track can be excited between the differently charged electrode fingers.

The acoustic wave propagates in a plane that is referred to as the x, y plane. In a two-dimensional space formed by the x, y plane, the wave can be characterized by a wave vector ($k_x$, $k_y$) with a longitudinal component $k_x$ and a transversal component $k_y$. The components $k_x$, $k_y$ are also referred to as the longitudinal and transversal wave numbers, respectively.

The acoustic track is arranged in the transversal direction y between two outside areas bounding it. The wave is preferably substantially attenuated or not capable of propagation in the outside area. The amplitude of the wave decays exponentially in the outside area in the transversal direction pointing away from the track. The outside areas can generally be formed by an exposed, or at least only partially metallized, substrate surface. In one advantageous variant, the outside area can be represented by a metal strip extending in the x direction, the width of which is $\lambda_y = 2\pi/k_y$.

The acoustic track has an excitation area and two peripheral areas, the excitation area being arranged between the peripheral areas. The peripheral areas and the outside areas are formed such that the longitudinal phase velocity of the acoustic wave is greater in the peripheral area than in the excitation area, the longitudinal phase velocity in the outside area being smaller than in the excitation area, with $k_y$ being real in the peripheral area and imaginary in the outside area. Although the wave is preferably excited only in the excitation area, thus not in the peripheral areas, it is capable of propagation not only in the excitation area but also in the peripheral areas, since $k_y$ is real there.

The width of the peripheral areas is preferably adjusted such that the absolute value of $k_y$ is substantially smaller, e.g., by at least a factor of 10, in the excitation area than in the peripheral areas and the outside areas. By means of the construction of the acoustic track and in particular a suitably selected width of the peripheral areas, $k_y=0$ is preferably achieved in the excitation area.

With the specified construction of the transducer, one can succeed in binding the acoustic mode to be excited (fundamental mode) substantially inside the acoustic track or substantially inside the excitation area.

All areas of the acoustic track and the outside areas extend in the longitudinal direction x and are thus parallel to one another. The velocity of the wave in the excitation area is greater than in the outside areas but smaller than in the peripheral areas of the acoustic track. In the transversal direction y, the transducer has the structure of a reverse waveguide. The acoustic track forms the core of this waveguide, while the outside areas form its cladding.

A waveguide area is understood to mean an area selected from a first outside area, a second outside area and various areas of the acoustic track, i.e., the excitation area as well as the first and second peripheral areas. In a selected i-th waveguide area in which the wave is capable of propagation, it holds that $(k_x)^2 + (k_{y,i})^2 = (\omega/v_i)$, $\omega$ being the circular frequency of the wave and $v_i$ its propagation velocity in the i-th waveguide area. $k_{y,i}$ is the transversal wave number in the respective waveguide area.

The acoustic wave is characterized by a transversal fundamental mode. The transversal fundamental mode results from the transversal velocity profile of a waveguide formed by the acoustic track and the outside areas, wherein most of the energy of the acoustic wave is concentrated in the acoustic track.

At least a part of the first bus bar can belong to the first outside area, and at least a part of the second bus bar can belong to the second outside area.

Corresponding to the usually periodic arrangement of the electrode fingers in the transducer, the acoustic wave mainly propagates in the two longitudinal directions. However, the transducer can also have a preferred emission of the excited acoustic waves in only one longitudinal direction. Such a transducer can be used, for instance, in a recursive filter.

The propagation velocity of the excited surface acoustic wave in the acoustic track is reduced for most piezoelectric substrates, e.g., quartz, $LiNbO_3$, $LiTaO_3$, by the metallization of the substrate surface, as compared with an exposed substrate surface.

A periodic arrangement of transversally extending metal strips will be referred to below as a grating arrangement. In place of metal strips, arbitrary other acoustic non-homogeneities—grooves, among other things—are suitable in principle for adjusting the velocity of the acoustic wave.

In the excitation area, the electrode fingers preferably form a grating arrangement. In the non-exciting transducer areas, particularly in the peripheral areas, the grating arrangement can be formed by successive areas of the electrode fingers, each at the same potential, bordering on the bus bar, or by an arrangement of stub fingers. The grating arrangement can also be constructed as a perforated metal strip.

In acoustic tracks with a periodic grating arrangement, the velocity of the surface waves diminishes with a diminishing distance between the centers of the grating structures (strips) for an equal proportion of metallized surface in the respective transducer area. This is due to the fact that the wave is increasingly decelerated at the finger edges as the grating period decreases. It is consequently advantageous if a higher velocity relative to the excitation area is achieved in the peripheral areas by selecting the distance between the periodically arranged metal strips to be larger than in the excitation area.

The velocity of the acoustic wave further depends on the metallization ratio, i.e., the proportion of metallized surface in the respective transducer area. Due to the increasing proportion of the transit path that is metallized, the velocity of the wave decreases with an increasing metallization ratio for an equal periodicity of the grating arrangement. It is consequently advantageous for a higher velocity to be achieved in the peripheral areas relative to the excitation area by selecting the mean metallization ratio to be lower there than in the excitation area. A lower velocity in the outside areas with respect to the excitation area can be achieved by selecting the mean metallization ratios there to be larger than in the excitation area. Continuous metallized outside areas are particularly advantageous. Other measures for lowering the velocity in the outside areas can also be taken.

Together with the outside areas adjoining it, a SAW track can act as a waveguide in the transversal direction if there is an angle range around the principal propagation direction for which a surface wave is capable of propagation in the acoustic track and this wave is simultaneously totally reflected at the border with the outside area, so that no loss due to transversal emission out of the acoustic track occurs.

In one variant, the specified transducer can have a track arrangement that comprises several electrically interconnected SAW tracks arranged parallel to one another. Together with the adjoining outside areas, this track arrangement can also act as a waveguide in the transversal direction in case the above-specified conditions for an acoustic track are met.

The excursion of the coupled acoustic wave is referred to as the excitation intensity. The acoustic track is characterized by the excitation intensity (in the longitudinal or transversal direction). The excitation intensity is proportional to the potential difference $\Delta U$ between the electrode fingers arranged one alongside the other in the longitudinal direction, which together form an excitation finger pair. The excitation intensity as a function of the transversal coordinate Y is referred to here as the excitation profile $\Psi_y$.

In the waveguide constructed in this manner, several transversal modes (fundamental mode and its harmonics) of the acoustic wave are capable of excitation or propagation. The maximum coupling of the electrical signals into the fundamental mode at a given frequency is achieved if the acoustic track is formed in the transversal direction such that the corresponding transversal excitation profile $\Psi_y$ of the wave is fitted to the shape $\Phi_y$ of the fundamental mode, where the relation $$\int \Psi_y \Phi_y dy / \sqrt{\int \Psi_y^2 dy \cdot \int \Phi_y^2 dy} \geq \alpha$$

can serve as a criterion for the fitting, wherein e.g., $\alpha=0.9$ and preferably $\alpha=0.95$ is selected. $\Phi_y$ is the excursion of the transversal fundamental mode as a function of the transversal coordinate Y.

With an optimal coupling of the electrical signal into the acoustic fundamental mode, the coupling into higher modes vanishes, so that the system of the transversal modes is approximately orthogonal.

The width of the peripheral area in the transversal direction is preferably $\lambda_y/8$ to $\lambda_y/4$, where $\lambda_y$ is the wavelength of the transversal fundamental mode in the corresponding peripheral area.

Since the absolute value of $k_y$ is considerably greater in the peripheral areas than in the excitation area, the excursion of the transversal modes in the transversal direction varies correspondingly faster in the peripheral areas. Since the value of the transversal wave number $k_y$ is imaginary in the outside area and greater in absolute value (e.g., by at least a factor of 10) than in the excitation area, a rapid decay of the transversal mode is guaranteed in the transversal direction. Therefore an approximately rectangular fundamental mode can be adjusted in the waveguide, the edge steepness of which depends on the absolute width of the peripheral tracks, and ultimately on the differences in the phase velocities of the wave in the peripheral areas, in the excitation area and in the outside areas.

The suppression of interfering transversal modes can be achieved by improving the coupling of an electrical signal into the transversal fundamental mode by means of the introduction and special design of the peripheral areas of the acoustic track.

The specified transducer with suppression of transversal wave modes has the advantage that, in the design of such a transducer, simulation of the wave propagation in only one direction (longitudinal direction) is necessary for a good agreement of the simulated and the actual transmission function of the transducer. It is possible to forgo an expensive simulation of two-dimensional wave propagation effects (in both the longitudinal and the transversal direction).

The subdivision of the transducer into an excitation area and two peripheral tracks differs from the known track subdivision into several subtracks in that no excitation of the acoustic wave in the longitudinal direction is provided in the peripheral areas of the transducer, but instead a targeted acceleration of the wave excited in the excitation area is provided.

The peripheral areas serve only to adjust the transversal waveguide fundamental mode (differing from sinusoidal) by predetermining the suitable velocity profile of the waveguide. To adjust the shape of the transversal fundamental mode, it is possible to vary, for instance, the width of the peripheral area and/or the phase velocity of the wave.

In order for the shape of the fundamental mode to be adapted as closely as possible to rectangular, it is advantageous if, for waves with a concave slowness, to be explained in connection with FIGS. 9A and 9B, the velocity of the wave in the peripheral areas is substantially greater than in the excitation area and the velocity in the outside areas is substantially smaller than in the excitation area. The velocity in the outside areas is preferably smaller than that in the excitation area by at least 2%, more preferably at least 3%. Even a difference of 5% or more can be achieved. The velocity in the peripheral areas is preferably greater by at least 2%, more preferably at least 3%, than that in the excitation area.

A reduction of the velocity in the outside area is achieved by as high a metallization ratio as possible, most suitably by the complete metallization of the surface of the underlying piezoelectric substrate. Moreover, a further lowering of the velocity in the outside area can be achieved by a metal thickness enlarged with respect to the acoustic track.

A lowering of the velocity in the outside area can also be achieved by using a metallization there with a decreased rigidity or greater density relative to the acoustic track, in particular, the excitation area. In the case of a transducer with aluminum-containing electrodes, for example, a layer of gold, platinum, copper or a sequence of layers thereof can be used in the outside area. It is also possible to use a layer sequence of arbitrary materials, preferably of a comparatively low rigidity or a comparatively high density.

A periodic grating arrangement with a period length that is enlarged relative to the excitation area can be used to increase the velocity in the peripheral areas. The metallization ratio in the peripheral areas can also be selected to be smaller than in the excitation area. In another variant, the metallization ratio in the excitation area and in the peripheral areas can be selected to be equal. For an equal periodicity of the grating arrangement, there is also the possibility of selecting the metallization ratio to be smaller in the peripheral areas than in the excitation area.

Particularly the transversal gaps of the transducer can be used as peripheral areas. A transversal gap is understood to mean an area that extends in the transversal direction between the ends of the fingers and the opposing collective electrodes or stub fingers. Since fingers are missing in this area compared to the excitation area, the center period length and the metallization ratio are reduced. The rectangular wave profile can then be adjusted by the width of the peripheral areas.

The peripheral areas can each also be realized as a subtrack in which the period length and the metallization ratio are selected suitably for the velocity that is to be achieved. The electrode fingers in the peripheral areas are also preferably arranged on a periodic grid.

An additional velocity increase in the peripheral area can be achieved by using a material with an increased rigidity or reduced density for the periodically arranged strips.

For example, one could use aluminum in the peripheral area for a transducer having copper-containing electrodes in the excitation area.

In all previously known methods the excitation profile of a transducer is adapted to the transversal fundamental mode.

Advantageous embodiments of the transducer provide for an additional fine adaptation of the transducer's excitation profile to the shape of the transversal fundamental mode established as just described.

The aforementioned fine adaptation can be realized, for instance, by subdividing the excitation area into several subtracks in the transversal direction, each subtrack forming a subtransducer. The subtracks or subtransducers are connected to one another in series or in parallel. The potential difference of the electrode fingers to be excited, and thus the excitation intensity in the subtracks, is reduced by the series connection. The subtracks are formed identically in the longitudinal direction apart from their width, the width of the subtracks being selected such that the transversal profile $\Psi_y$ of the excitation intensity in the excitation area is adapted to the shape $\Phi_y$ of the transversal fundamental mode.

The transducer will be described below with reference to embodiments and the associated figures. The figures are schematic and not drawn to scale. Identical or identically functioning parts are labeled with identical reference characters.

DESCRIPTION OF THE DRAWINGS

FIG. 1 schematically shows a transducer, the change of the wave number in the transversal direction, the shape of the corresponding fundamental mode and the transversal velocity profile;

FIG. 4, another transducer, the excitation area of which is subdivided into subtracks connected in series and in parallel (bottom), the corresponding transversal fundamental mode and the shape of the transversal fundamental mode (top);

FIG. 7, a) excursion of the wave modes capable of propagation in the acoustic track for a non-adapted transversal profile and b) the excitation intensity corresponding to the modes;

FIG. 8, a) excursion of the wave modes capable of propagation in the acoustic track for a transversal profile adapted to the fundamental mode and b) the excitation intensity corresponding to the modes;

DETAILED DESCRIPTION

FIG. 1 shows a SAW transducer with an acoustic track AS that is arranged on a piezoelectric substrate such as 42°YX LiTaO$_3$ and in which a surface acoustic wave can be propagated in the longitudinal direction x, the square of the wave number k$_y$ of the transversal mode as a function of the transversal coordinate Y, the transversal fundamental mode $\Phi_y$ (top) and a transversal velocity profile (bottom).

Acoustic track AS is subdivided into an excitation area MB and two peripheral areas RB1 and RB2. The width of the peripheral area in the transversal direction is preferably $\lambda_y/8$ to $\lambda_y/4$, where $\lambda_y$ is the wavelength of the transversal fundamental mode in the peripheral area.

The wave number k$_y$ describes in each transversal area MB, RB1, RB2, AU1, AU2 the dependence of the transversal excursion $\Phi_y$ of the fundamental mode on the transversal coordinate Y as $\Phi_y = Ae^{jk_yy} + Be^{-jk_yy}$, where A and B are coefficients.

The transducer has two electrodes, each comprising a bus bar E1, E2 and electrode fingers connected to them. Bus bars E1, E2 are relatively wide, continuously metalized surfaces.

Figure 6A:
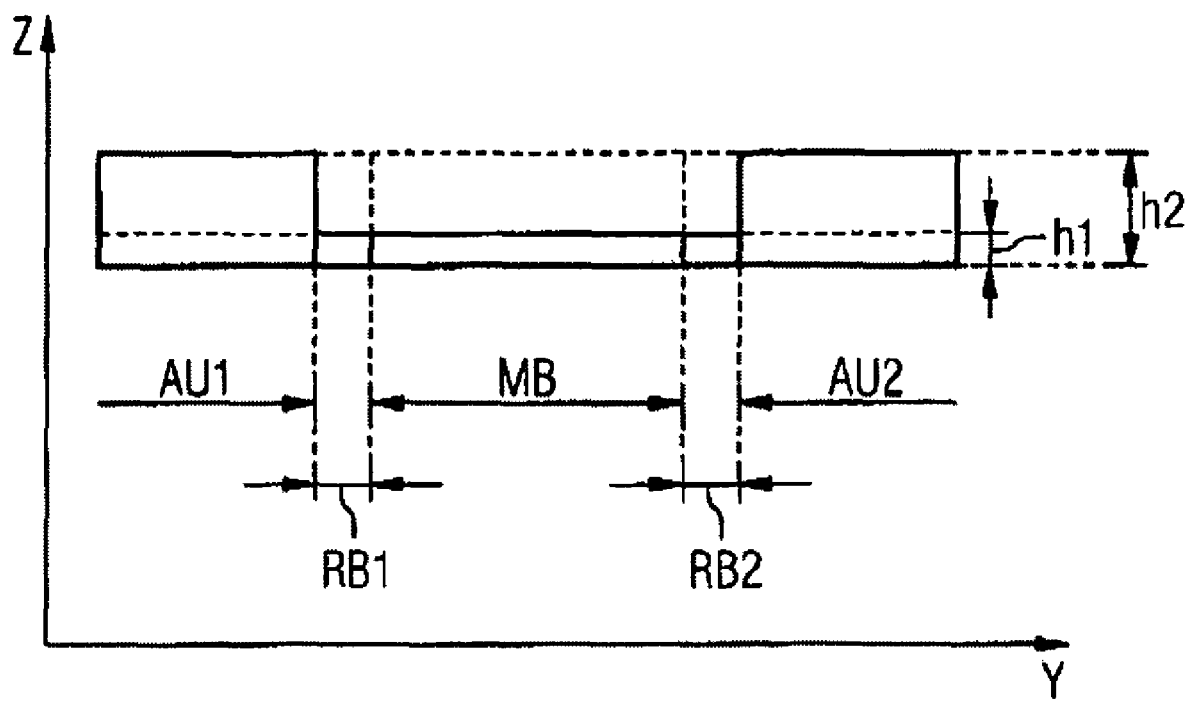
FIG. 6A, transversal profile of the metallization height for a transducer with outside areas that are thickened relative to the excitation area.
Figure 6B:
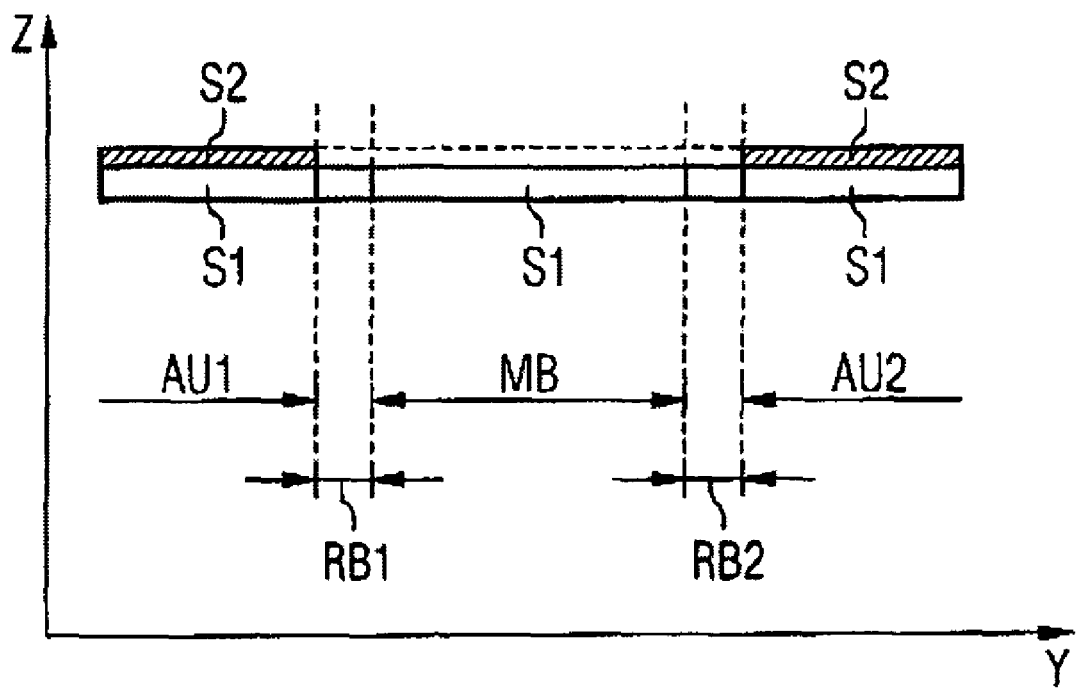
FIG. 6B, transversal profile of the metallization height for a transducer with outside areas that are thickened by an additional material layer.

In advantageous embodiments the metallization height is greater there than in acoustic track AS; see FIGS. 6A and 6B.

The height profile of the transducer along the transversal direction Y is schematically shown in FIG. 6A. The height direction Z is oriented perpendicular to the surface of the substrate. The metal structures arranged in excitation area MB and in peripheral areas RB1, RB2 have a thickness or height $h_1$. An additional metallization of the same material, aluminum or an aluminum alloy for example, with a height $h_2-h_1$ is placed in the outside area. This additional metallization brings about a lowering of the velocity in the outside area.

The electrode structures, such as the electrode fingers in excitation area MB, the periodic grating in peripheral areas RB1, RB2, as well as the structures—e.g., bus bars E1, E2—belonging to outside areas AU1, AU2, are also formed at a height $h_1$ in metal layer S1 deposited on the substrate. The same material, such as aluminum or an aluminum alloy, is used in layer S1 in all areas. In FIG. 6B, an additional layer S2 made of a material that preferably has a higher density and/or a lower rigidity than the material of layer S1 is applied on top of layer S1 to thicken the metal structures formed in this layer in the outside areas AU1, AU2. Gold, platinum and copper are particularly suitable for layer S2. A relatively large velocity excursion can be achieved with a relatively low overall thickness of the structures arranged in outside area AU1, AU2.

Outside areas AU1, AU2 in the example of FIG. 1 are formed such that the velocity of the surface wave there is reduced relative to excitation area MB. The width of the bus bars is preferably at least $10\lambda_x$. The electrode fingers of different electrodes are arranged alternately in the excitation area and form excitation finger pairs. The excitation profile of acoustic track AS is defined by the excitation area and is rectangular in the example.

The electrode fingers in one peripheral area all belong to the same electrode and are therefore inactive, i.e., the acoustic wave is not excited in this peripheral area. Although peripheral areas RB1, RB2 are not excited, a wave is induced there by the excitation in the excitation area.

The peripheral areas in this embodiment have a grating structure, in which the periodicity of the grating is chosen to be larger than the average pitch of excitation area MB. An increase of the phase velocity v of the acoustic wave in a peripheral area RB1, RB2 results, because a wave there sees fewer edges of the grating in comparison with excitation area MB. Moreover, the lower metallization ratio in the peripheral area relative to the excitation area contributes to the increase of the wave's velocity, so that the velocity $v_{RB}$ in peripheral area RB1, RB2 is greater than the velocity $v_{MB}$ in excitation area MB. On the other hand, outside areas AU1, AU2 are formed such that the velocity $v_{AU}$ in outside areas AU1, AU2 is less than the velocity $v_{MB}$ in excitation area MB.

Together, acoustic track AS and the metallized outside areas AU1, AU2 that bound the acoustic track on all sides form a waveguide. The transversal waveguide modes are characterized by a phase factor $e^{jk_y y}$. For bound wave modes, the transversal wave number $k_y$ is real inside the core area of the wave guide (i.e., acoustic track AS) and imaginary in the surrounding area of the waveguide (outside areas AU1, AU2).

In absolute value, $k_y$ is substantially smaller—e.g., by a factor of at least 10—in excitation area MB than in areas RB1, RB2, AU1, AU2. For $k_y=0$ (in the excitation area) the fundamental mode has a plateau in this area, i.e., the excursion of the wave in the excitation area is constant in the transversal direction y.

In outside areas AU1, AU2, which lie outside of acoustic track AS and adjoin it in the transversal direction, $k_y$ is imaginary, or $(k_y)^2<0$. Therefore, the amplitude of the wave decreases exponentially in the exponential direction in outer areas AU1, AU2.

The transversal wave number $k_y$ is real in the respective peripheral area RB1, RB2, or $(k_y)^2>0$. A transition from the maximum amplitude in the excitation area to a fraction of the amplitude at the boundary to the outside area takes place there.

The value of the wavelength $\lambda_y$ in the peripheral area depends on the propagation velocity of the wave in the longitudinal direction, which depends in turn on the pitch of the electrode finger grating in the peripheral area. The absolute width of the peripheral area can be selected with various values (depending on the specified value of $\lambda_y$). The width of the peripheral area measured in wavelengths is preferably $\lambda_y/8$ to $\lambda_y/4$. By changing the absolute width of the peripheral area, the steepness of the corresponding flank of the fundamental mode can be adjusted. The thus selected width of the peripheral area determines the form of the transversal fundamental mode, at which the amplitude of the wave exponentially decreases in the outside areas and at which a standing wave is formed in the transversal direction in the peripheral areas, wherein the antinode of a standing wave is situated at the edge of the excitation area and the peripheral area. Since the wave decays to zero in the outside area, no zero point of the excursion appears in the peripheral area. For this reason it is advantageous if the width of the peripheral area is at most $\lambda_y/4$. The width of the peripheral area preferably lies between $\lambda_y/8$ and $\lambda_y/4$. A width of the peripheral area that amounts substantially to $\lambda_y/4$ is particularly advantageous, since it is accompanied by only a slight penetration of the wave into the outside area. The shape of the fundamental mode is thereby maximally adapted to the shape of the rectangular excitation profile of acoustic track AS.

The width W of the peripheral area can be determined, for example, from the relationship $$\tan(k_{y,RB} W) = \frac{|k_{y,AU}|}{k_{y,RB}}$$

where $k_{y,RB}$ is the transversal wave number in the peripheral area and $k_{y,AU}$ is the transversal wave number in the outside area. It was assumed here that $k_y \approx 0$ in the outside area. A small penetration of the wave into the outside area is thus synonymous with a larger value of the ratio $|k_{y,AU}|/k_{y,RB}$. The transducer areas are preferably constructed such that $|k_{y,AU}|/k_{y,RB} \geq 1$.

The larger the wave number $k_y$ is in the peripheral area, the smaller is the corresponding wavelength and consequently the absolute width of the peripheral area. For large values of $k_y$ the steepness of the flanks of the transversal fundamental mode increases accordingly.

The electrode fingers are generally perpendicular to the longitudinal direction X, which is the main propagation direction of the wave. In the ideal case of infinitely long fingers, the acoustic wave propagates in the main propagation direction. Due to the finite size of the excitation area in the acoustic track, propagation also takes place in directions deviating from the main propagation direction within an angle range $-\theta_{max}<\theta<\theta_{max}$. $\theta$ is the angle between the propagation direction and the main propagation direction. The dependence of the wave velocity v on the angle $\theta$ in this angle range determines whether the transducer can act as a waveguide for this wave.

Figure 9A:
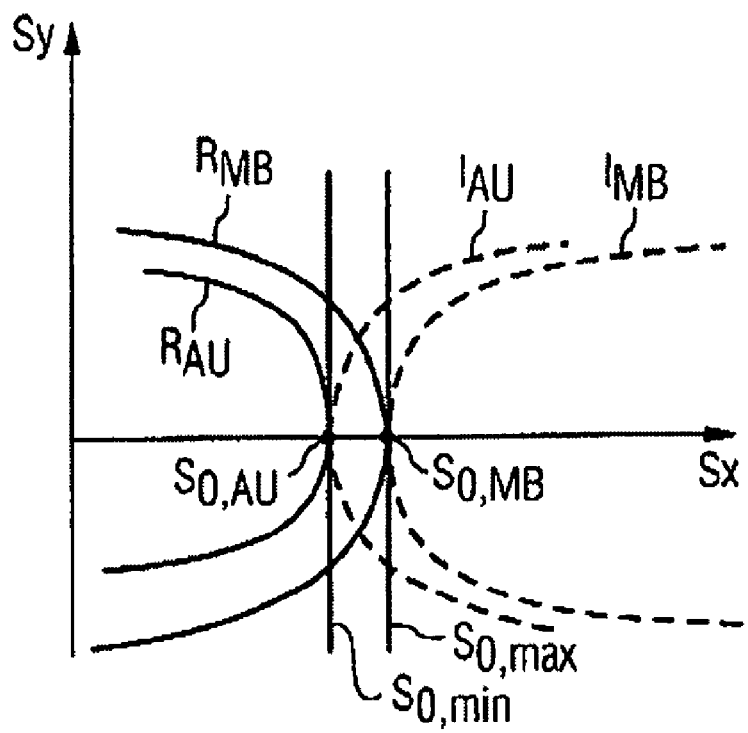
FIG. 9A, slowness curves for a waveguide with a convex slowness.
Figure 9B:
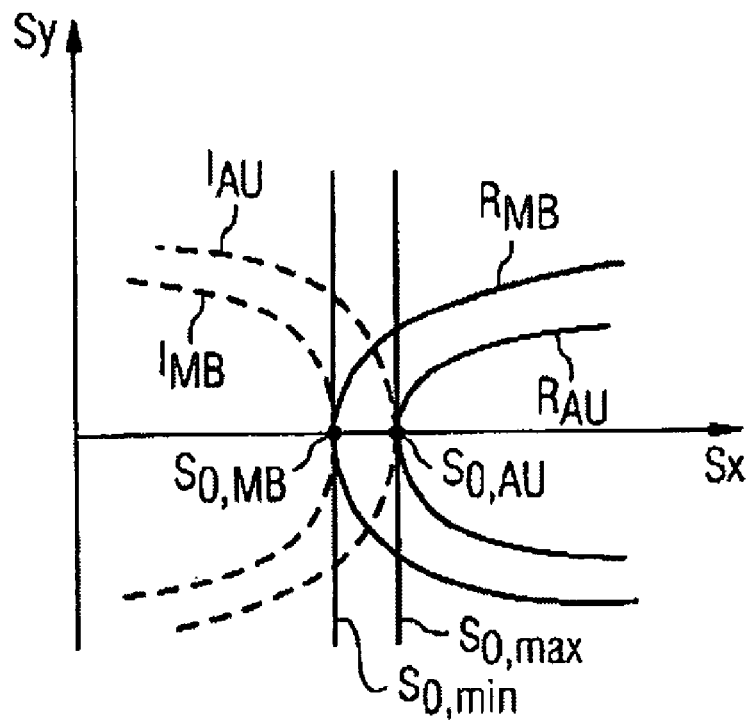
FIG. 9B, slowness curves for a waveguide with a concave slowness.

The decisive point for this is the behavior of the curves $s_y(s_x)$ in the core and the cladding of the waveguide, which are shown in FIGS. 9A and 9B. $s_x=k_x/\omega$ and $s_y=k_y/\omega$ are components of the slowness vector $\vec{s}=\vec{k}/\omega$ in the x and y directions, respectively. $\vec{k}$ is the wave number vector.

The slowness component $s_y$ contains a real part $\text{Re}\{s_y\}$ and an imaginary part $\text{Im}\{s_y\}$. $\text{Re}\{s_y\}/s_x=\tan(\theta)$. These curves are referred to in the present field as the slowness, since they indicate the inverse of the velocity for the angle $\theta$.

$R_{MB}$ and $R_{AU}$ designate the slowness curve $\text{Re}\{s_y(s_x)\}$ in the excitation area MB and the outside area AU1, AU2 of the transducer, respectively, i.e., the real value of the slowness component $s_y$ in the respective area plotted versus $s_x$. $I_{MB}$ and $I_{AU}$ designate the slowness curve $\text{Im}\{s_y(s_x)\}$ in the excitation area MB and the outside area AU1, AU2 of the transducer, respectively, i.e., the imaginary value of the slowness component $s_y$ in the respective area plotted versus $s_x$.

A distinction is made between a convex and a concave slowness. Convex slowness (FIG. 9A) signifies that for an increasing absolute value of $\theta$, the component $s_x$ of the slowness vector decreases and the component $\text{Re}\{s_y\}$ increases in absolute value. This means that the wavelength $\lambda_x$ increases with increasing absolute value of $\theta$, and the wavelength $\lambda_y$ decreases.

Concave slowness (FIG. 9B) means, on the other hand, that both $s_x$ and $\text{Re}\{s_y\}$ increase in absolute value for an increasing absolute value of $\theta$. Consequently the wavelengths $\lambda_x$ and $\lambda_y$ decrease with increasing $\theta$ in the case of concave slowness. For the specified transducer, transducers on those piezoelectric substrates that have a concave slowness are considered particularly appropriate.

Wave guiding only exists in a defined angle range, i.e., only in the area of the slowness curve $R_{MB}$ that lies between the straight lines $s_x=s_{0,min}$ and $s_x=s_{0,max}$. For convex slowness therefore, $s_{0,min}=S_{0,AU}$ and $s_{0,max}=S_{0,AB}$. For convex slowness, $s_{0,min}=S_{0,AB}$ and $s_{0,max}=S_{0,AU}$.

From the peak $S_{0,MB}$, $S_{0,AU}$ of a slowness curve $R_{MB}$, $R_{AU}$, respectively, which corresponds to the angle $\theta=0$, the phase velocity $v_{MB}=1/S_{0,MB}$ and $v_{AU}=1/S_{0,AU}$ of the wave in the longitudinal direction in the excitation area and the outside area, respectively, can be determined. Since $S_{0,AU}<S_{0,MB}$ for convex slowness, see FIG. 9A, the speed for a waveguide that is characterized by a convex slowness is greater in the outside area than in the excitation area, i.e., $v_{AU}>v_{MB}$. Consequently, the transducer acts like a waveguide in the case of convex slowness if the velocity in the outside area is higher than in the acoustic tracks.

It can be analogously derived from the condition $S_{0,AU}>S_{0,MB}$ existing for concave slowness that in this case the waveguide is formed if the velocity in the outside area is lower than in the acoustic track.

For the piezoelectric substrate on which the transducer is formed, the following is preferably the case. For a direction that differs from the longitudinal propagation direction X only slightly, e.g., by at most $\pm 10\%$, the wave number can be described approximately by the relation $$\left(\frac{2\pi f}{v_{MB}}\right)^2 = k_x^2 + k_y^2(1+\gamma)$$

(parabolic approximation), where f is the operating frequency of the transducer, $v_{MB}$ is the velocity of the acoustic wave in the longitudinal direction X in the excitation area, and $\gamma$ is the anisotropy parameter. The slowness is concave for $\gamma<-1$ and convex for $\gamma>-1$. In the scope of this approximation, the advantageous width W of the peripheral areas results as $$\frac{v_{MB}}{8f}\sqrt{\frac{(1+\gamma)v_{MB}}{2\Delta v_{RB}}} = \frac{\lambda_y}{8} \leq W \leq \frac{\lambda_y}{4} = \frac{v_{MB}}{4f}\sqrt{\frac{(1+\gamma)v_{MB}}{2\Delta v_{RB}}},$$

where $\Delta v_{RB}$ is the velocity difference between the excitation and the peripheral area, i.e., $\Delta v_{RB}=v_{MB}-v_{RB}$. $v_{RB}$ is the velocity in the peripheral area. It was assumed that $k_y=0$ in the excitation area. A particularly small amount of energy penetrates into the outside area if the condition $|k_{y,AU}|/k_{y,RB}\geq 1$ is satisfied. This is equivalent in the parabolic approximation to the condition $|\Delta v_{AU}/v_{RB}|\geq 1$. $v_{AU}$ is the velocity in the outside area and $\Delta v_{AU}=v_{MB}-v_{AU}$.

The excitation area in FIG. 1 is formed as in a recursive filter. It is also possible, however, to form the excitation area of the transducer in the longitudinal direction at least in part as in a conventional normal finger transducer—see FIGS. 2A, 2B—with interdigital fingers arranged at a periodic pitch, or in a conventional split finger transducer.

Figure 2A:
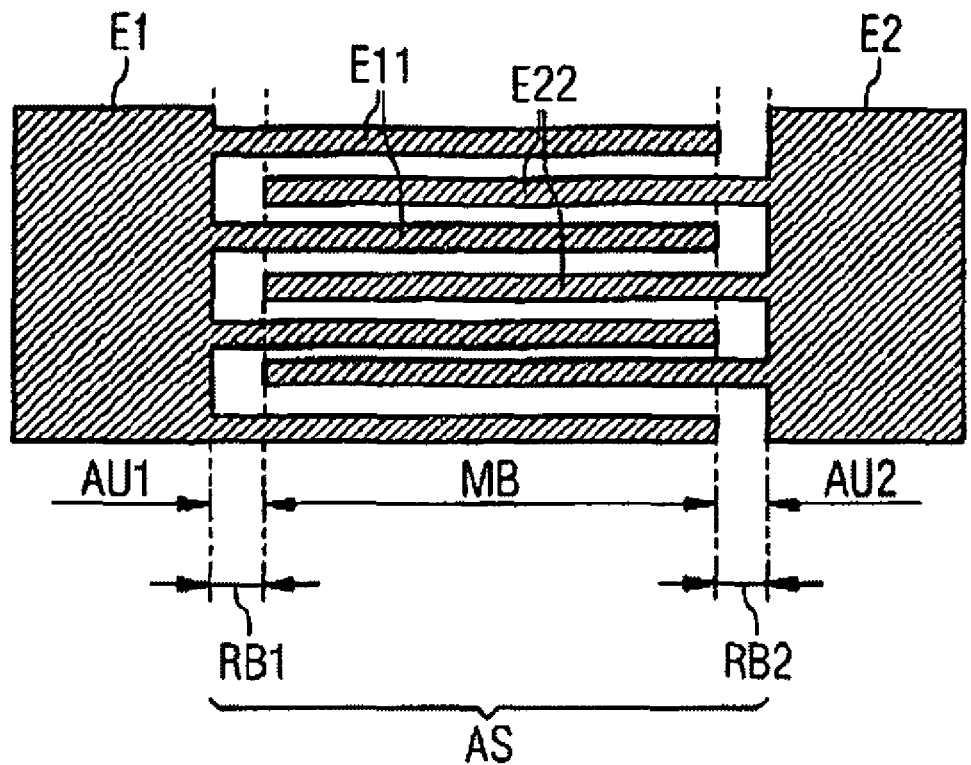
FIG. 2A, a transducer in which peripheral areas are formed between the ends of electrode fingers and the bus bars facing them.

In the variant represented in FIG. 2A, transversal peripheral area RB2 is formed between the ends of first electrode fingers E11 and the second bus bar E2, and transversal peripheral area RB1 is formed between the ends of second electrode fingers E22 and first bus bar E1. Due to the larger grating period relative to excitation area MB, and to the reduced metallization ratio, a higher velocity arises in peripheral areas RB1, RB2 than in the excitation area MB.

Figure 2B:
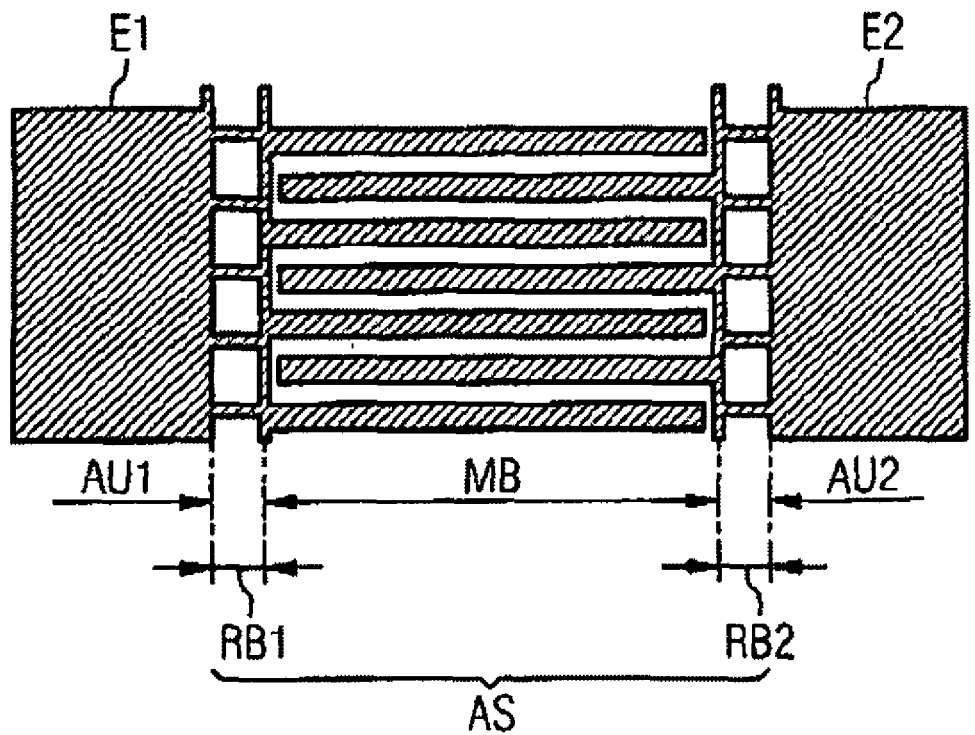
FIG. 2B, a transducer in which peripheral areas are formed as perforated areas of the bus bar.

The grating arrangement in the variant according to FIG. 2A in edge area RB1, RB2 is predetermined by the finger arrangement, i.e., the grating arrangement in excitation area MB. In FIG. 2B, the transducer is subdivided into subtracks with mutually independent grating arrangements. Excitation area MB represents the central subtrack and peripheral areas RB1, RB2 the outward-directed subtracks of acoustic track AS. Peripheral areas RB1, RB2 can be considered here to be perforated areas of bus bars E1, E2, respectively.

Peripheral areas RB1, RB2 in FIG. 2B are configured as grating arrangements with a period length that is increased relative to excitation area MB, and with a metallization ratio that is reduced relative to that area. The embodiment with independent subtracks has the advantage that the velocity in the peripheral area can be adjusted as desired.

It is not possible in practice to achieve a perfect rectangular transversal fundamental mode by introducing the peripheral areas, since the absolute width of the peripheral areas cannot be selected to be arbitrarily small. Therefore a fine adaptation of the transducer's transversal excitation profile to the transversal fundamental mode is provided in further variants of the transducer by, for instance, subdividing the excitation area into several subtracks. Such a fine adaptation is possible only in a very narrow frequency range, since the shape of the fundamental mode is frequency-dependent.

Figure 3:
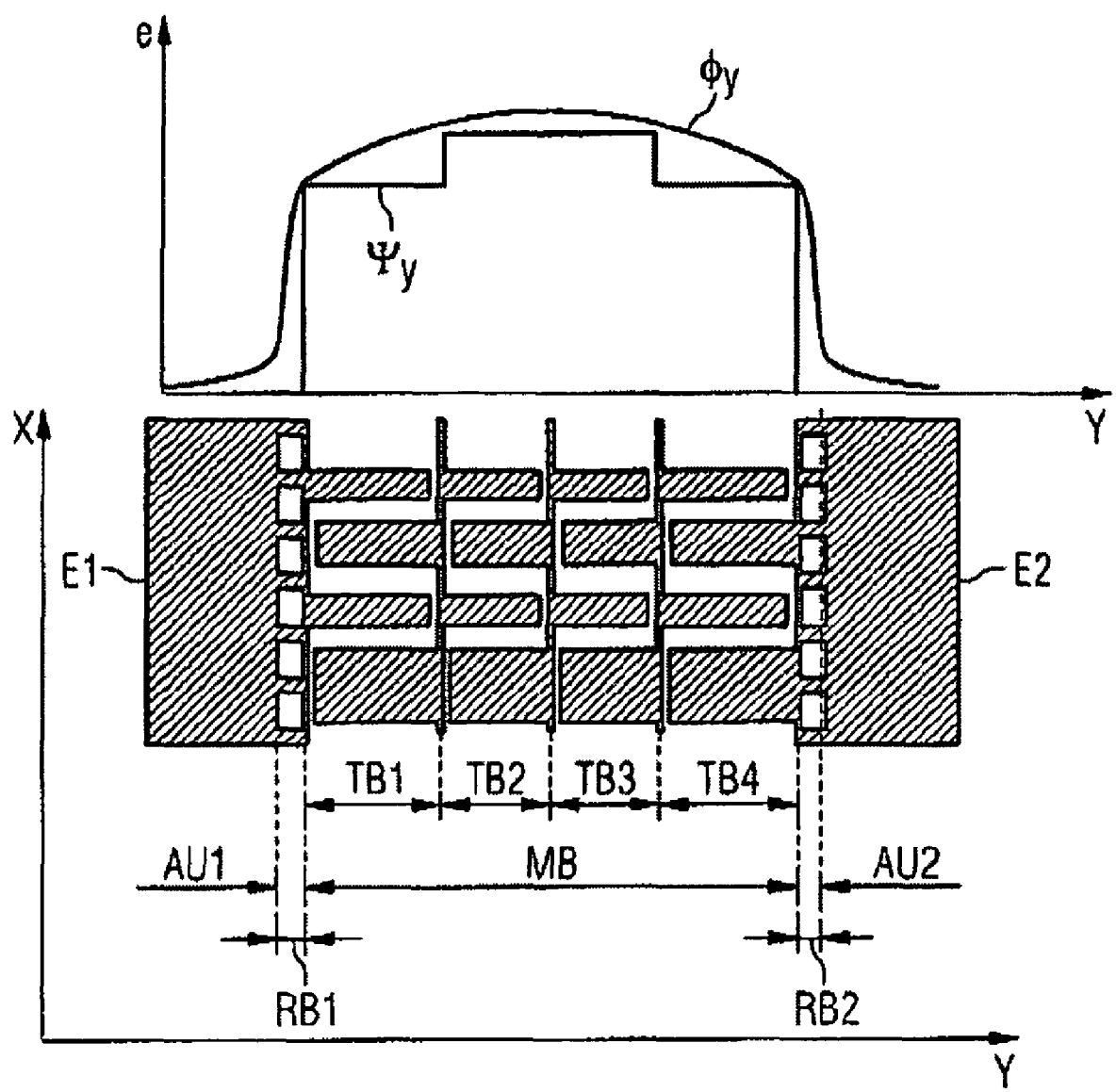
FIG. 3, an additional transducer, the excitation area of which is subdivided into interconnected subtracks, the corresponding excitation profile and the shape of the transversal fundamental mode (top)

FIG. 3 shows a refinement of the transducer in which excitation area MB of acoustic track AS is subdivided in the transversal direction into four subtracks TB1, TB2, TB3 and TB4. The subtracks are connected electrically in series.

FIGS. 3 and 4 each schematically show a part of the acoustic track AS at the bottom, and the corresponding excitation profile $\Psi_y$ of the area as well as the shape of the transversal mode $\Phi_y$ at the top.

All subtracks of such a subdivided excitation area are formed identically in the longitudinal direction X with respect to the electrode structure-width, connection sequence, spacing between the successive fingers, the widths of the subtracks in the transversal direction Y preferably being selected to be different. Subtrack number i has a width $b_i$. For example, the center subtracks TB2, TB3 presented in FIG. 3 are narrower in the transversal direction than the subtracks TB1, TB4 facing the peripheral areas.

The voltage difference between the two electrodes of the transducer is U. The excitation intensity of an electrode pair in a subtrack is proportional to the voltage difference $U_i$ between electrode fingers. $U_i$ is inversely proportional to the capacitance of the subtrack, which in turn is directly proportional to the width $b_i$ of the subtrack:

$$U_i = \frac{b_i^{-1}}{\sum_k b_k^{-1}} U.$$

Therefore one can adjust or weight the excitation intensity in subtrack i by deliberately varying its width. For a series connection of the subtracks, the impedance of the acoustic track AS with a subdivided excitation area is correspondingly larger than the impedance of an acoustic track with a non-subdivided excitation area.

In order to maintain the impedance of the acoustic track that has been subdivided into subtracks, it is possible to connect some of the subtracks to one another in series and to connect this series connection in parallel to one or more additional subtracks, see for example, the embodiment presented in FIG. 4.

Excitation area MB is subdivided into the following subtracks: a center subtrack MT and two peripheral subtracks RT1 and RT2. Peripheral subtracks RT1 and RT2 are connected to one another in series, the series connection of subtracks RT1 and RT2 being connected in parallel to center subtrack MT. The width of center subtrack MT is substantially larger—preferably by at least a factor of 5—than the width of the respective peripheral subtrack RT1 and RT2. The impedance of acoustic track AS is substantially determined by the impedance of the wider subtrack MT. The reduction of the excitation intensity in the respective peripheral subtrack RT1 and RT2 with respect to center subtrack MT, which is at potential U, is achieved by dividing the applied potential U between the series-connected peripheral subtracks RT1 and RT2.

Figure 5:
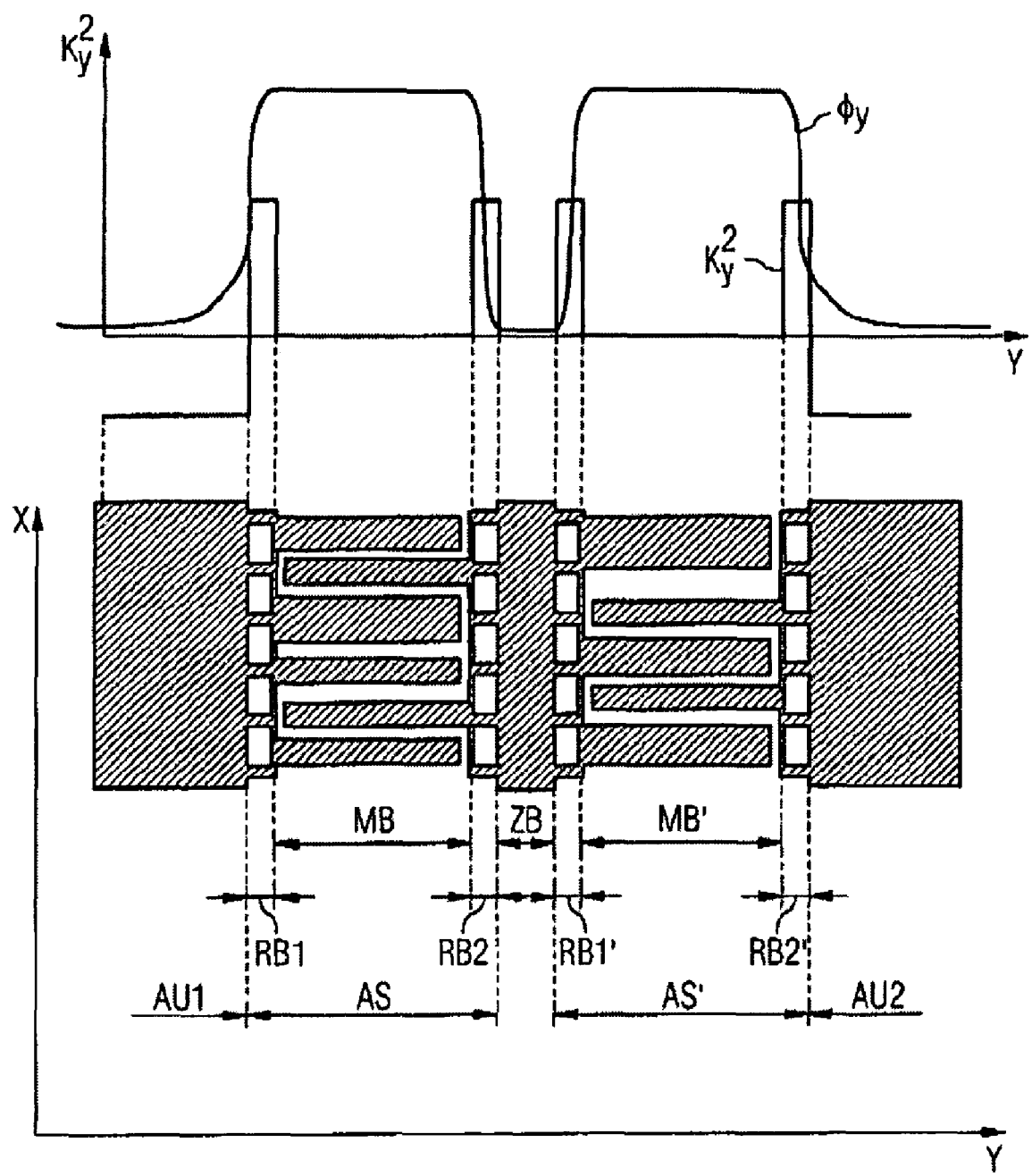
FIG. 5, an additional transducer with several acoustic tracks connected one after the other (bottom), the corresponding transversal fundamental mode and the change of the wave number in the transversal direction (top)

An additional variant of the transducer is schematically shown in FIG. 5. This figure shows sections of the transducer (bottom), the corresponding transversal fundamental mode and the square of the transversal wave number as a function of the transversal coordinate (top).

In this variant an additional acoustic track AS' is provided that, similarly to acoustic track AS, is subdivided into an excitation area MB' and peripheral areas RB1' and RB2', and is constructed substantially identically to acoustic track AS. In this embodiment, acoustic tracks AS and AS' are electrically connected to one another in series, and connected to one another in parallel in the transversal direction. An intermediate area ZB is arranged between acoustic tracks AS and AS'. The widths of peripheral areas RB1, RB2 and RB1', RB2' of acoustic tracks AS and AS', respectively, are adjusted such that $k_y$ is substantially smaller (e.g., by at least one order of magnitude) in intermediate area ZB than in peripheral areas RB1, RB2 and outside areas AU1, AU2. In order for a relatively rapid decay of the fundamental mode to be achieved in intermediate area ZB, $k_y$ is preferably purely imaginary there.

For this purpose, the same measures can be taken as in the outside area—additional metallization height, or the use of materials with increased density or decreased rigidity.

It is also possible to connect to the two parallel-arranged acoustic tracks to one another in parallel. In case of more than two parallel-arranged acoustic tracks, it is also possible to combine a series and a parallel connection of the tracks.

For each additional acoustic track of a transducer with a multi-track construction, peripheral areas with $(k_y)^2 > 0$ are provided in which the acoustic wave is not excited, but the wave excited in the corresponding excitation area is able to propagate in the longitudinal direction. Between each two acoustic tracks, an intermediate area with an imaginary $k_y$ is provided. There is no excitation of the acoustic wave in the intermediate areas. Each intermediate area is preferably formed as a continuous metal strip with an increased layer thickness relative to the excitation areas, and/or using materials with an increased density or reduced rigidity relative to the excitation areas. The electrode fingers in the excitation areas can also be arranged periodically or can form unidirectionally radiating cells.

The shape of the transversal fundamental mode, with an approximately constant excursion in the areas corresponding to the excitation areas and a vanishing excursion in the intermediate areas, can be adjusted by the appropriate selection of the absolute widths of the peripheral areas, wherein the width of a peripheral area measured in wavelengths is always an eighth of a wavelength to a fourth of a wavelength. In this manner the shape of the transversal fundamental mode is adapted to the excitation profile of a multitrack arrangement.

The suppression of higher transversal waveguide modes is explained in FIGS. 7 and 8 in a transducer that is constructed on a substrate with a concave slowness such as 42° rot yx LiTaO$_3$. These higher wave modes are the cause of undesired secondary maxima in the resonator admittance or the filter function, the phase factors of which—curves 11, 12, 13—are shown as a function of the transversal coordinates at the top in FIG. 7 and the relative intensities of which are schematically shown at the bottom in FIG. 7.

The transversal mode with order number 1 is the transversal fundamental mode, which is sinusoidal in a conventionally constructed acoustic track (with an excitation area, but without peripheral areas). This mode is indicated in FIG. 7 by curve 11. The relative intensity of the first transversal mode is approximately 84%. Additional transversal wave modes with an uneven order number are excited in an acoustic track formed in this way. The standing acoustic wave that corresponds to the second transversal wave mode (curve 12) cannot be excited in the waveguide, due to the symmetry conditions.

The relative intensity of the third transversal wave mode (the second harmonic of the fundamental mode, see curve 13 in FIG. 7) is here roughly 9% and the relative intensity of the fifth wave mode, not shown in FIG. 7, is approximately 3%.

The coupling of the electrical signal into the third and the fifth transversal modes arises because the transversal excitation profile of the acoustic track is rectangular, while the shape of the transversal mode is sinusoidal. These modes lead to undesired resonances above the passband of the filter, which deteriorate the filter quality (among other things, the insertion loss in the passband as well).

With an excitation profile and a shape of the transversal fundamental mode that are adapted to one another, the higher transversal wave modes are not excited.

The phase factors of the transversal waveguide modes that can be excited in, or are capable of propagation in, the acoustic track constructed according to FIG. 1 are shown at the top in FIG. 8, and the relative intensities of the modes at the bottom in FIG. 8. The phase factors of the first, second and third transversal modes correspond to the curves 11', 12', 13'. The relative intensity of the higher transversal modes is very low in comparison with the intensity of the transversal fundamental mode.

Curves 14 and 14' in FIGS. 7 and 8 reproduce the velocity profile of a waveguide corresponding to the respective acoustic track, with reference to the propagation velocity of the wave in the longitudinal direction. It is shown in FIG. 8 that the propagation velocity of the wave in the peripheral areas of the acoustic track is higher than in other areas of the waveguide.

The specified transducer can in principle be used in all conventionally known SAW components, e.g., double mode SAW filters, normal finger transducers or recursive filters and is not limited to the number of elements shown in the figures or to specific frequency ranges.

The invention claimed is:

1. A transducer operating with surface acoustic waves, comprising:
    an acoustic track in which an acoustic wave can be propagated, the acoustic track having a transversal fundamental mode, the acoustic track being subdivided in a transversal direction into an excitation area and two peripheral areas;
    a first outside area and a second outside area bordering the acoustic track such that the acoustic track is arranged in the transversal direction between the first and second outside areas;
    the peripheral areas are configured such that the longitudinal phase velocity $v_{RB}$ of the acoustic wave in the respective peripheral area is greater than the longitudinal phase velocity $v_{MB}$ of the wave in the excitation area; wherein:
    the outside areas configured such that the longitudinal phase velocity $v_{AU}$ of the acoustic wave in the respective outside area is less than $v_{MB}$,
    the peripheral areas and outside areas are configured such that $(k_y)^2 > 0$ in the respective peripheral area and $(k_y)^2 < 0$ in the respective outside area, where $k_y$ is the wave number of the transversal fundamental mode in the respective area;
    a width of the peripheral areas in the transversal direction is configured relative to a width of the excitation area such that $k_y$ is substantially constant in the excitation area and is less in absolute value by at least a factor of 10 than in the peripheral areas and the outside areas; and
    the width of the respective peripheral area in the transversal direction is between $\pi/(4k_{y,RB})$ and $\pi/(2k_{y,RB})$, where $k_{y,RB}$ is the wave number of the fundamental mode in the respective peripheral area.

2. The transducer of claim 1, wherein $k_y \approx 0$ in the excitation area.

3. The transducer of claim 1, wherein:
    the transducer is on a piezoelectric substrate selected such that for the velocity $v_{MB}$ of the surface wave in the excitation area the piezoelectric substrate holds within an angle range around the propagation direction (X) according to:

$$\left(\frac{2\pi f}{v_{MB}}\right)^2 = k_x^2 + k_y^2(1+\gamma),$$

where f is the operating frequency of the transducer, $k_x$ is the wave number in the longitudinal direction and $\gamma$ is the anisotropy parameter of the substrate, with $\gamma < -1$,
the width W of the peripheral areas is substantially $$\frac{\lambda_y}{8} \le W \le \frac{\lambda_y}{4},$$

where $\lambda_y$ is the wavelength of the wave propagating in the transversal direction, and $$\lambda_y = \frac{v_{MB}}{f}\sqrt{\frac{(1+\gamma)}{2\Delta v_{RB}}} \text{ and } \Delta v_{RB} = v_{MB} - v_{RB}.$$

4. The transducer of claim 1, wherein the outside areas are configured such that the phase velocity of the acoustic wave in the outside areas is at least 3% lower than the phase velocity of the acoustic wave in excitation area.

5. The transducer of claim 1, wherein the width of the respective outside area in the transversal direction is at least $\lambda_x$, where $\lambda_x$ is the wavelength in the main propagation direction X in excitation area.

6. The transducer of claim 1, further comprising:
    a first bus bar;
    first electrode fingers connected to a the first bus bar,
    a second bus bar, and
    second electrode fingers connected to a the second bus bar, wherein the first electrode fingers and second electrode fingers interleave, wherein:
    the first outside area comprises at least part of the first bus bar, and
    the second outside area comprises at least part of the second bus bar.

7. The transducer of claim 6, wherein the first and second outside areas each comprise a continuous metal strip in the longitudinal direction, the thickness of the metal strip being greater than the thickness of the electrode fingers in the excitation area.

8. The transducer of claim 6, wherein:
    the first peripheral area extends between the ends of the first electrode fingers and the second bus bar, and
    the second peripheral area extends between the ends of the second electrode fingers and the first bus bar.

9. The transducer of claim 6, wherein:
    the first peripheral area comprises a perforated area of the first bus bar, and
    the second peripheral area comprises a perforated area of the second bus bar.

10. The transducer of claim 6, wherein the first and second peripheral areas have a substantially periodic arrangement of metal strips, the period of the periodic arrangement of the metal strips being greater than the period of the electrode fingers in the excitation area.

11. The transducer of claim 1, wherein the first and second outside areas each have at least two sublayers of different materials.

12. The transducer of claim 11, wherein at least one of the at least two sublayers is in the first and second outside areas and has one or both of a greater density and a lesser rigidity than the material of the electrode fingers in the excitation area.

13. The transducer of claim 1, wherein the excitation area is subdivided in the transversal direction into several subtracks corresponding to subtransducers that are connected to one another in series or in parallel.

14. The transducer of claim 13, wherein:
the subtracks in the propagation direction have the same electrode finger structure, and
the width of the subtracks is configured such that the transversal profile $\Psi_y$ of the excitation intensity in the excitation area is adapted to the shape $\Phi_y$ of the transversal fundamental mode.

15. The transducer of claim 13, wherein for the adaptation of the transversal profile $\Psi_y$ of the excitation intensity to the shape $\Phi_y$ of the transversal fundamental mode holds $$\int \Psi_y \Phi_y dy \Big/ \sqrt{\int \Psi_y^2 dy \cdot \int \Psi_y^2 dy} \geq 0,9.$$

16. The transducer of claim 13, wherein:
the several subtracks comprise a center subtrack and two peripheral subtracks, wherein
the peripheral subtracks are electrically connected to one another in series and form a series circuit,
the series circuit is connected in parallel to the center subtrack, and
the width of center subtrack is at least 5 times greater than the width of the respective peripheral subtrack.

17. The transducer of claim 1, wherein a ratio of metalized surface area in the respective peripheral area and the area of the whole peripheral area is smaller than a ratio of metallized surface area in the excitation area and the area of the whole excitation area.

18. The transducer of claim 1, wherein a ratio of metalized surface area in the outside area and the area of the whole outside area is greater than a ratio of metallized surface area in the excitation area and the area of the whole excitation area.

19. The transducer operating with surface acoustic waves of claim 1, wherein the transducer is included in a filter.

20. The transducer of claim 1, wherein:
the excitation area is subdivided in the longitudinal direction into unidirectionally emitting or reflecting cells,
several electrode fingers in the excitation area arranged one alongside the other in the longitudinal direction form at least one of a cell with emission of the acoustic wave in a preferred direction and a cell with a reflecting function.

21. The transducer of claim 1, further comprising:
at least one additional acoustic track alongside the acoustic track, the at least one additional acoustic track being subdivided into an excitation area and peripheral areas and constructed substantially identically to the acoustic track, the acoustic track and the additional acoustic track being arranged in parallel with an intermediate area between the acoustic track and the additional acoustic track,
wherein the transversal wave number $k_y$ in the excitation areas of the acoustic track and the additional acoustic track is smaller by at least a factor of 10 than the transversal wave number $k_y$ in the intermediate area.

22. The transducer of claim 1, wherein the excitation area, the outside areas, and the peripheral areas are constructed such that: $(v_{MB}-v_{AU})/(v_{RB}-v_{MB})>1$.

23. A transducer operating with surface acoustic waves, comprising:
an acoustic track in which an acoustic wave can be propagated, the acoustic track having a transversal fundamental mode, the acoustic track being subdivided in a transversal direction into an excitation area and two peripheral areas;
a first outside area and a second outside area bordering the acoustic track such that the acoustic track is arranged in the transversal direction between the first and second outside areas;
the peripheral areas are configured such that the longitudinal phase velocity $v_{RB}$ of the acoustic wave in the respective peripheral area is greater than the longitudinal phase velocity $v_{MB}$ of the wave in the excitation area; wherein:
the outside areas configured such that the longitudinal phase velocity $v_{AU}$ of the acoustic wave in the respective outside area is less than $v_{MB}$;
the peripheral areas and outside areas are configured such that $(k_y)^2>0$ in the respective peripheral area and $(k_y)^2<0$ in the respective outside area, where $k_y$ is the wave number of the transversal fundamental mode in the respective area;
a width of the peripheral areas in the transversal direction is configured relative to a width of the excitation area such that $k_y$ is substantially constant in the excitation area and is less in absolute value by at least a factor of 10 than in the peripheral areas and the outside areas;
the excitation area is subdivided in the longitudinal direction into unidirectionally emitting or reflecting cells,
several electrode fingers in the excitation area arranged one alongside the other in the longitudinal direction form at least one of a cell with emission of the acoustic wave in a preferred direction and a cell with a reflecting function.

24. A transducer operating with surface acoustic waves, comprising:
an acoustic track in which an acoustic wave can be propagated, the acoustic track having a transversal fundamental mode, the acoustic track being subdivided in a transversal direction into an excitation area and two peripheral areas;
a first outside area and a second outside area bordering the acoustic track such that the acoustic track is arranged in the transversal direction between the first and second outside areas;
the peripheral areas are configured such that the longitudinal phase velocity $v_{RB}$ of the acoustic wave in the respective peripheral area is greater than the longitudinal phase velocity $v_{MB}$ of the wave in the excitation area; wherein:
the outside areas configured such that the longitudinal phase velocity $v_{AU}$ of the acoustic wave in the respective outside area is less than $v_{MB}$;
the peripheral areas and outside areas are configured such that $(k_y)^2>0$ in the respective peripheral area and $(k_y)^2<0$ in the respective outside area, where $k_y$ is the wave number of the transversal fundamental mode in the respective area;
a width of the peripheral areas in the transversal direction is configured relative to a width of the excitation area such that $k_y$ is substantially constant in the excitation area and is less in absolute value by at least a factor of 10 than in the peripheral areas and the outside areas; and
the transducer is on a piezoelectric substrate selected such that for the velocity $v_{MB}$ of the surface wave in the excitation area the piezoelectric substrate holds within an angle range around the propagation direction (X) according to:

$$\left(\frac{2\pi f}{V_{MB}}\right)^2 = k_x^2 + k_y^2(1+\gamma),$$

where f is the operating frequency of the transducer, $k_x$ is the wave number in the longitudinal direction and $\gamma$ is the anisotropy parameter of the substrate, with $\gamma<-1$,
the width W of the peripheral areas is substantially $$\frac{\lambda_y}{8} \leq W \leq \frac{\lambda_y}{4},$$

where $\lambda_y$ is the wavelength of the wave propagating in the transversal direction, and $$\lambda_y = \frac{V_{MB}}{f}\sqrt{\frac{(1+\gamma)V_{MB}}{2\Delta V_{RB}}} \text{ and } \Delta V_{RB} = V_{MB} - V_{RB}.$$

25. A transducer operating with surface acoustic waves, comprising:
- an acoustic track in which an acoustic wave can be propagated, the acoustic track having a transversal fundamental mode, the acoustic track being subdivided in a transversal direction into an excitation area and two peripheral areas;
- a first outside area and a second outside area bordering the acoustic track such that the acoustic track is arranged in the transversal direction between the first and second outside areas;
- the peripheral areas are configured such that the longitudinal phase velocity $v_{RB}$ of the acoustic wave in the respective peripheral area is greater than the longitudinal phase velocity $v_{MB}$ of the wave in the excitation area; wherein:
- the outside areas configured such that the longitudinal phase velocity $v_{AU}$ of the acoustic wave in the respective outside area is less than $v_{MB}$,
- the peripheral areas and outside areas are configured such that $(k_y)^2 > 0$ in the respective peripheral area and $(k_y)^2 < 0$ in the respective outside area, where $k_y$ is the wave number of the transversal fundamental mode in the respective area;
- a width of the peripheral areas in the transversal direction is configured relative to a width of the excitation area such that, $k_y$ is substantially constant in the excitation area and is less in absolute value by at least a factor of 10 than in the peripheral areas and the outside areas;
- the excitation area is subdivided in the transversal direction into several subtracks corresponding to subtransducers that are connected to one another in series or in parallel; and
- the subtracks in the propagation direction have the same electrode finger structure, and
- the width of the subtracks is configured such that the transversal profile $\Psi_y$ of the excitation intensity in the excitation area is adapted to the shape $\Phi_y$ of the transversal fundamental mode.

\* \* \* \* \*

UNITED STATES PATENT AND TRADEMARK OFFICE
CERTIFICATE OF CORRECTION

| | | |
|---|---|---|
| PATENT NO. | : 7,868,717 B2 | |
| APPLICATION NO. | : 12/158171 | |
| DATED | : January 11, 2011 | |
| INVENTOR(S) | : Markus Mayer, Karl Christian Wagner and Andreas Bergmann | |

It is certified that error appears in the above-identified patent and that said Letters Patent is hereby corrected as shown below:

Claim 3, Column 14, Line 15-17 (Approx.) – delete

" $\lambda_y = \frac{v_{MB}}{f} \sqrt{\frac{(1+\gamma)}{2\Delta v_{RB}}}$ and $\Delta v_{RB} = v_{MB} - v_{RB}$. " and insert -- $\lambda_y = \frac{v_{MB}}{f} \sqrt{\frac{(1+\gamma)v_{MB}}{2\Delta v_{RB}}}$ and $\Delta v_{RB} = v_{MB} - v_{RB}$. --, therefor.

Claim 6, Column 14, Line 29 – after "to" delete "a".

Claim 6, Column 14, Line 31 – after "to" delete "a".

Claim 15, Column 15, Line 15-16 (Approx.) – delete

" $\int \Psi_y \Phi_y dy / \sqrt{\int \Psi_y^2 dy \cdot \int \Psi_y^2 dy} \geq 0,9$. " and insert -- $\int \Psi_y \Phi_y dy / \sqrt{\int \Psi_y^2 dy \cdot \int \Phi_y^2 dy} \geq 0,9$. --, therefor.

Claim 17, Column 15, Line 28 – delete "metalized" and insert -- metallized --, therefor.

Claim 18, Column 15, Line 33 – delete "metalized" and insert -- metallized --, therefor.

Claim 24, Column 17, Line 21-24 (Approx.) – delete

" $\lambda_y = \frac{v_{MB}}{f} \sqrt{\frac{(1+\gamma)v_{MB}}{2\Delta v_{RB}}}$ and $\Delta v_{RB} = v_{MB} - v_{RB}$. " and insert Signed and Sealed this
Twenty-sixth Day of April, 2011

David J. Kappos
*Director of the United States Patent and Trademark Office*

CERTIFICATE OF CORRECTION (continued)
U.S. Pat. No. 7,868,717 B2

$$\lambda_y = \frac{v_{MB}}{f} \sqrt{\frac{(1+\gamma)v_{MB}}{2\Delta v_{RB}}} \quad \text{and } \Delta v_{RB} = v_{MB} - v_{RB}.$$

--, therefor.